Dec. 13, 1966 Y. GOLAHNY 3,292,013

DIVIDER CIRCUIT PROVIDING QUOTIENT OF AMPLITUDES OF PAIR OF INPUT SIGNALS

Filed Sept. 24, 1964 3 Sheets-Sheet 1

INVENTOR.
YEHUDA GOLAHNY
BY David A. Rich
ATTORNEY.

INVENTOR.
YEHUDA GOLAHNY
BY David A. Rich
ATTORNEY.

INVENTOR.
YEHUDA GOLAHNY
BY David A. Rich
ATTORNEY 3,292,013
DIVIDER CIRCUIT PROVIDING QUOTIENT OF AMPLITUDES OF PAIR OF INPUT SIGNALS

Yehuda Golahny, Newton, Mass., assignor to Mithras, Inc., Cambridge, Mass., a corporation of Delaware Filed Sept. 24, 1964, Ser. No. 398,897
6 Claims. (Cl. 307—88.5)

The present invention relates to analogue computers. More particularly, the invention relates to apparatus for dividing a pair of input signals and producing an output signal representative of the quotient.

Prior art divider circuits are relatively complex in structure and operation. For example, in an article entitled "New Monitor for Reactors" by Erick Valentine, which appeared on page 30 of Electronics, December 6, 1963, an instrument is described and illustrated for measuring the sub-critical reactivity in nuclear piles. The circuit as described therein includes a variable gain amplifier having a variable impedance photoconductor connected to ground. The impedance of the photoconductor is controlled by the variation of a light source which in turn is controlled by a bipolar transistor amplifier. The amplifier is adapted to receive a pair of signals which differ in frequency. The high frequency signal is coupled through a high-pass filter and demodulated and coupled to an output indicator. The lower frequency signal is coupled through a low-pass filter and demodulated for coupling to an integrator circuit which provides a varying D.C. bias voltage on the base of the bipolar transistor. The collector of the bipolar transistor is connected to a source of negative voltage and the emitter is connected directly in series with the light source. In contrast, the present invention presents a divider circuit which requires only a simple field effect transistor connected in series with a bipolar transistor to effect control of a variable gain amplifier.

It is therefore an object of the invention to provide a divider circuit which is relatively simple in structure and operation.

A further object of the invention is to provide an improved divider circuit having a relative broad dynamic range of operation.

Still another object of the invention is to provide an improved divider circuit for producing an output signal which represents the quotient between a pair of input signals differing in a selected characteristic.

In accordance with the invention there is provided a divider circuit. The circuit includes a variable gain amplifier means adapted to receive a pair of signals which are distinguishable with respect to a selected characteristic. Gain control means are provided having an active element directly coupled to the amplifier means for controlling the gain of the amplifier means. Gain control bias filter means are coupled to the amplifier means and the control means for biasing the gain control means only in accordance with the amplitude of a selected one of the signals. Output signal means are coupled to the amplifier means for producing an output signal representative of the quotient between the selected signal and the other signal.

In one form of the invention the amplifier means includes a bipolar transistor having its emitter coupled to a field effect transistor. In another form of the invention the signals differ in frequency and the bias filter means passes only the selected signal. In still another form of the invention a direct current path extends from the emitter to the drain of the field effect transistor.

Other and further objects of the invention will be apparent from the following description taken in connection with the accompanying drawings and its scope will be pointed out in the appended claims.

The present invention has application to a pair of input signals which are distinguishable in the frequency, phase or time domain. For D.C. signals, the input signals may be chopped and time-sharing to provide an output signal representative of the quotient between them. Where the signals are distinct in phase only they may be separated by means of a pair of phase sensitive rectifiers which operate in the sense of the present invention as filters for selecting out one or the other of the signals.

Figure 1:
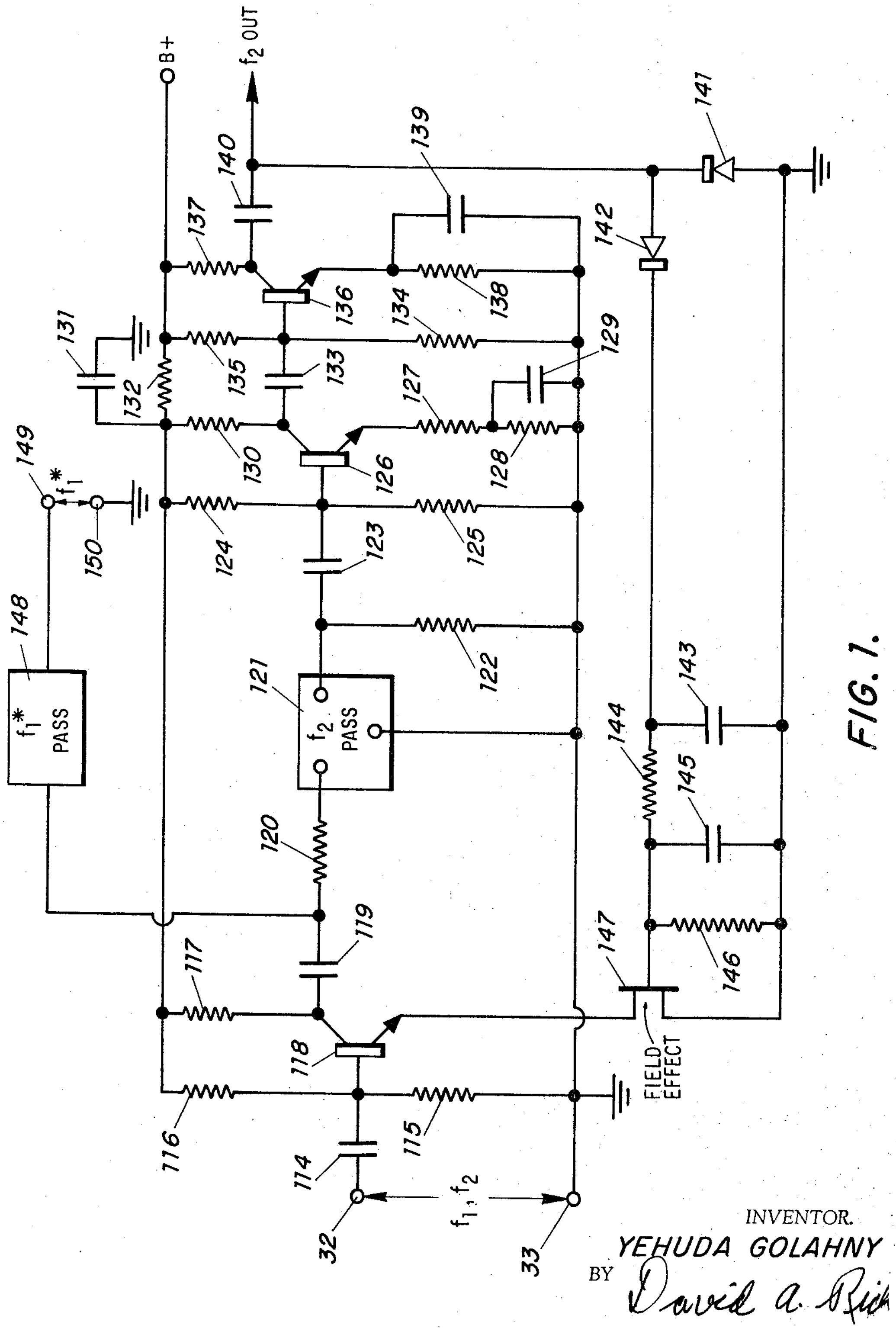
FIG. 1 is a schematic circuit diagram of a divider circuit embodying the present invention.

Referring now to FIG. 1, there is here illustrated a detailed schematic circuit diagram of a preferred embodiment of the divider circuit of the present invention. An input signal is applied to the terminals 32 and 33 including a composite $f_1$ signal representing, e.g., horizontal, vertical and intensity, $\overline{X}$, $\overline{Y}$ and I information and an $f_2$ signal representing intensity, I, information. The signal is coupled through a capacitor 114 and appears across a resistor 115 connected between the base of a transistor 118 and ground. The base is connected through a resistor 116 to a dropping resistor 132 to a source of positive voltage labeled B+. The emitter of the transistor 118 is connected through a field effect or unipolar transistor 147 to ground. The collector of the transistor 118 is coupled through a resistor 117 to B+. The output of the transistor 118 is connected through a capacitor 119 and resistor 120 to an $f_2$ pass filter 121. Another output of the transistor 118 is coupled through the capacitor 119 to a divided $f_1$* pass filter 148 to output terminals 149 and 150.

The output of the filter 121 is coupled through a two stage resistance coupled amplifier associated with a pair of transistors 126 and 136. The filter 121 is coupled through a resistor 122 to ground and through a capacitor 123 to the base of the transistor 126. The base of the transistor 126 is connected through a base resistor 125 to ground and through a dropping resistor 124 to B+. The collector is coupled through a load resistor 130 to B+. A decoupling capacitor 131 is connected between the resistance 130 and 132 and ground. The emitter of the transistor 126 is connected through a degenerative bias resistor 127 and bias resistor 128 to ground. In parallel with the resistor 128 is a by-pass capacitor 129. The collector of the transistor 126 is coupled through a capacitor 133 to a base resistor 134 of the transistor 136. The base is connected through a dropping resistor 135 to B+. The emitter is connected through a bias resistor 138 and parallel by-pass capacitor 139 to ground. The collector is connected through a load resistor 137 to B+ and is coupled through a capacitor 140 to a discharge diode 141 to ground. The capacitor 140 is connected to a diode 142 and to a resistance-capacitance filter comprising the series resistor 144 and by-pass capacitors 143 and 145 as shown. The junction between the capacitor 145 and the resistor 144 is connected to the gate or grid of the field effect transistor 147. A grid load resistor 146 is connected between the grid of the transistor 147 and ground. The cathode or source of the transistor 147 is grounded and the plate or drain is connected directly to the emitter of the transistor 118.

OPERATION

Since $f_1$ is a function of azimuth, elevation and intensity, i.e., $\overline{X}$, $\overline{Y}$ and I, and $f_2$ is a function of intensity, I, the purpose of the circuit is to provide a voltage ratio of the form: Equation 1 $e_1/e_2=e_3$ where $e_1$ and $e_2$ are distinct and separable signals representative of $f_1$ and $f_2$ respectively, and $e_3$ is representative of $f_1$*. Given an amplifier having a transfer function with gain A such that: Equation 2 $Ae_2=e_0=\text{constant}$, then Equation 3 $A=C/e_2$.

By applying an input signal $e_1$ through the amplifier, we obtain: Equation 4 $e_3=Ae_1$. Substituting from Equation 3 above, we obtain: Equation 5 $e_3=Ce_1/e_2$, where C is any gain constant and can be made equal to 1.

It is then necessary that the amplifier have sufficient gain to maintain the amplified signal $e_2$ equal to a constant over the operating range. With reference to the circuit in FIG. 1, the composite signal $f_1$ and the intensity signal $f_2$ are impressed on the terminals 32 and 33 and coupled to the transistor 118. The bipolar transistor 118 has a variable gain characteristic which is determined by the impedance in the emitter circuit as provided by the field effect transistor 147. If $f_2$ were not present, the circuit associated with the transistor 118 amplifies the $f_1$ signal to saturation amplitude and provides in its output the composite $f_1$ signal. Given the presence, however, of an $f_2$ signal, an $f_2$ signal is coupled through the filter 121 and amplified by two stages of amplification associated with the transistors 126 and 136 to apply an amplified $f_2$ signal to the rectifying diode 142.

The rectified signal is coupled to the circuit comprising the resistor 144 and capacitors 143 and 145 to apply a D.C. voltage across the gate resistor 146 of the field effect transistor 147. In closed loop operation, the D.C. voltage variations are relatively compressed. As the amplitude of the $f_2$ signal tends to increase the impedance of the transistor 147 increases to decrease the gain of the amplifier associated with the transistor 118. The decrease in gain is in accordance with the incremental increase in amplitude of the $f_2$ signal representative of intensity. As the amplification or gain of the transistor 118 goes down the output signal $f_1$* decreases in amplitude; inversely with the intensity. Thus, effectively the composite signal $f_1$ is divided by the intensity signal $f_2$ to produce an output signal $f_1$* which is independent of the intensity.

In a divider circuit which was actually built and tested, there follows a list of circuit elements which were used in the circuit of FIG. 1. It will be understood that these circuit elements are representative only of a particular embodiment and may be varied greatly without departing from the scope of the invention. Capacitor 114, 22 microfarads; resistor 115, 33 kilohms; resistor 116, 390 kilohms; transistors 118, 126 and 136, 2N929; transistor 147, 2N2Y98; resistor 117, 4.7 kilohms; capacitor 119, 15 microfarads; resistor 120, 5.6 kilohms; filter 121, 1300 cycles bandpass filter as manufactured by United Transformer Corp.; resistor 122, 10 kilohms; capacitor 123, 10 microfarads; resistor 124, 220 kilohms; resistor 125, 68 kilohms; resistor 127, 100 ohms; resistor 128, 3.3 kilohms; capacitor 129, 39 microfarads; resistor 130, 3.3 kilohms; capacitor 131, 20 microfarads; resistor 132, 1 kilohm; capacitor 133, 15 mircrofarads; resistor 134, 33 kilohms; resistor 135, 120 kilohms; resistor 137, 3.3 kilohms; resistor 138, 1 kilohm; capacitor 139, 39 microfarads; capacitor 140, 6.8 microfarads; diodes 141 and 142, 1N628; capacitor 143, 6.8 microfarads; resistor 144, 10 kilohms; capacitor 145, 1 microfarad; resistor 146, 68 kilohms; B+, 12 volts; filter 148, 400 cycles bandpass filter manufactured by United Transformer Corp.

Figure 2:
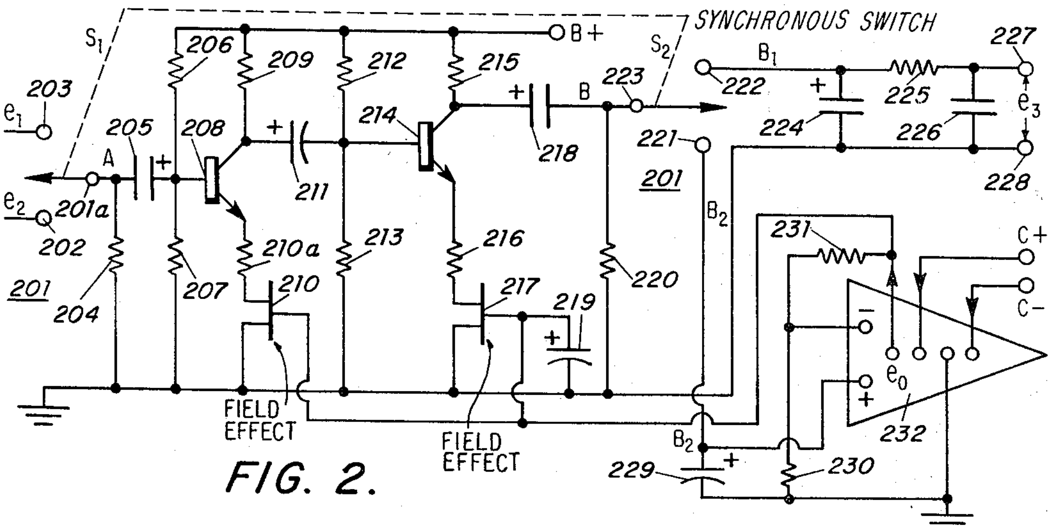
FIG. 2 is a schematic circuit diagram of a modification of the circuit in FIG. 1 adapted to a pair of differing input D.C. signals.

Referring now to FIG. 2, there is here illustrated a divider circuit adapted to divide a pair of D.C. signals $e_1$ and $e_2$. The signals are chopped and alternately applied to the divider. The denominator $e_2$ is fed back to a variable gain amplifier in the manner described above.

The circuit in FIG. 2 includes a two stage, resistance coupled, variable gain amplifier. Each stage has a bipolar transistor having its emitter connected to the drain of a field effect transistor. The amplifier circuit is associated with a pair of bipolar transistors 208 and 214 and with corresponding field effect transistors 210 and 217, respectively. A chopper or high frequency synchronous switch controls the application of each of a pair of input D.C. signals as well as the output and feedback signals.

A pair of input signals $e_1$ and $e_2$ are applied to terminals 202 and 203 of a double-throw, double-pole chopper or high frequency synchronous switch 201. The switching frequency may be, e.g., 400 cycles per second. The switch section marked $S_1$ has a rotor **201*a* coupled through a resistor 204 to ground. The signals are coupled through a capacitor 205 to a bipolar transistor 208 having its emitter connected through a resistor 210*a* and the drain of the field effect transistor 210 to ground, and having its collector coupled through a load resistor 209 to a source of positive voltage labeled B+. The base of the transistor 208 is coupled through a resistor 207 to ground and through a resistor 206 to B+. The output of the collector is coupled through a capacitor 211 to appear across a resistor 213 connected to ground. The capacitor 211 is coupled through a resistor 212 to B+ and to the base of a bipolar transistor 214. The emitter of the transistor 214 is coupled through a resistor 216 and the drain of the field effect transistor 217 to ground. A by-pass capacitor 219 is connected from the gate or grid of the transistor 217 to ground. The collector of the transistor 214 is coupled through a resistor 215 to B+ and through a capacitor 218 to a resistor 220 at the rotor 223 of the switch section $S_2$ of the switch 201. The rotor 223 is variously coupled to a terminal 221 or a terminal 222. The terminal 222 is coupled through a resistance-capacitance filter with a resistor 225 connected in series and a pair of by-pass capacitors 224 and 226 connected in parallel to ground as shown. The output voltage $e_3$ appears between the terminals 227 and 228**.

The terminal 221 of $S_2$ is connected to a capacitor 229 to ground. The capacitor is coupled to an operational amplifier 232 having a negative and positive terminal as indicated. The negative terminal of the amplifier 223 is connected through a resistor 230 to ground and through a resistor 231 to an output terminal of the amplifier 232 and to the gates or grids of the field effect transistors 210 and 217. Supply voltages marked C+ and C− are connected to the amplifier as shown.

Figure 3:
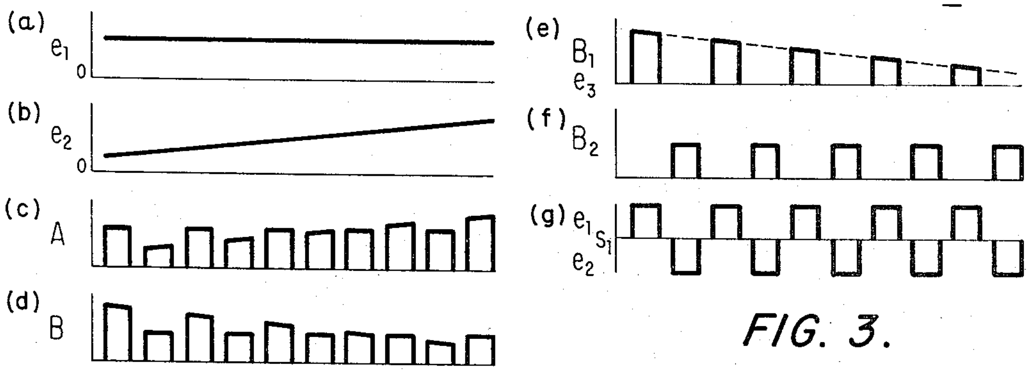
FIG. 3 is a series of graphs relative to the operation of the circuit in FIG. 2.

In FIG. 3 there is presented a series of graphs illustrating the operating voltages and signals at the various indicated points in the circuit. The operational amplifier 232 produces an output voltage $e_0$ which controls the impedance of the field effect transistors to control the gain of the bipolar transistors 208 and 214 to provide an output signal $e_3$ representative of the division of the input signals $e_1$ and $e_2$.

The curve (*a*) in FIG. 2 illustrates a constant D.C. signal $e_1$ applied to the terminal 203. The curve (*b*) illustrates a rising D.C. signal $e_2$ as applied to the terminal 202. The curve (*c*) illustrates the output of the switch **201*a*** at the point A. The curve (*d*) illustrates the composite signal output at the point B. The curve (*e*) illustrates the divided output signal at the point $B_1$ which is then filtered to provide a D.C. signal $e_3$ corresponding to the dashed lines as shown. The curve (*f*) illustrates the signal at the point $B_2$ which is held substantially constant. The curve (*g*) merely illustrates the position of the switch $S_1$ with respect to time and with respect to the D.C. signals $e_1$ and $e_2$.

The operation of the circuit in FIG. 2 is broadly similar to that described above with the circuit in FIG. 1 differing in detail to the extent necessary to process D.C. signals displaced in time as opposed to A.C. signals displaced in frequency. Thus the signals $e_1$ and $e_2$ are impressed on the terminals 203 and 202 of the switch $S_1$ and coupled to a two stage amplifier circuit associated with the bipolar transistors 208 and 214. These transistors have variable gain which is determined by the field effect transistors 210 and 217. Through the operation of the synchronous switch $S_2$ the amplifier signal $e_2$ is coupled through the terminal 221 to the operational amplifier 232 which produces a bias on the field effect transistors 210 and 217 causing their impedances to increase as the amplitude of the input signal $e_2$ tends to increase. The gain of the amplifier associated with the bipolar transistors 208 and 214 is accordingly decreased to produce output signal $e_3$ as shown in FIG. 2.

Figure 4:
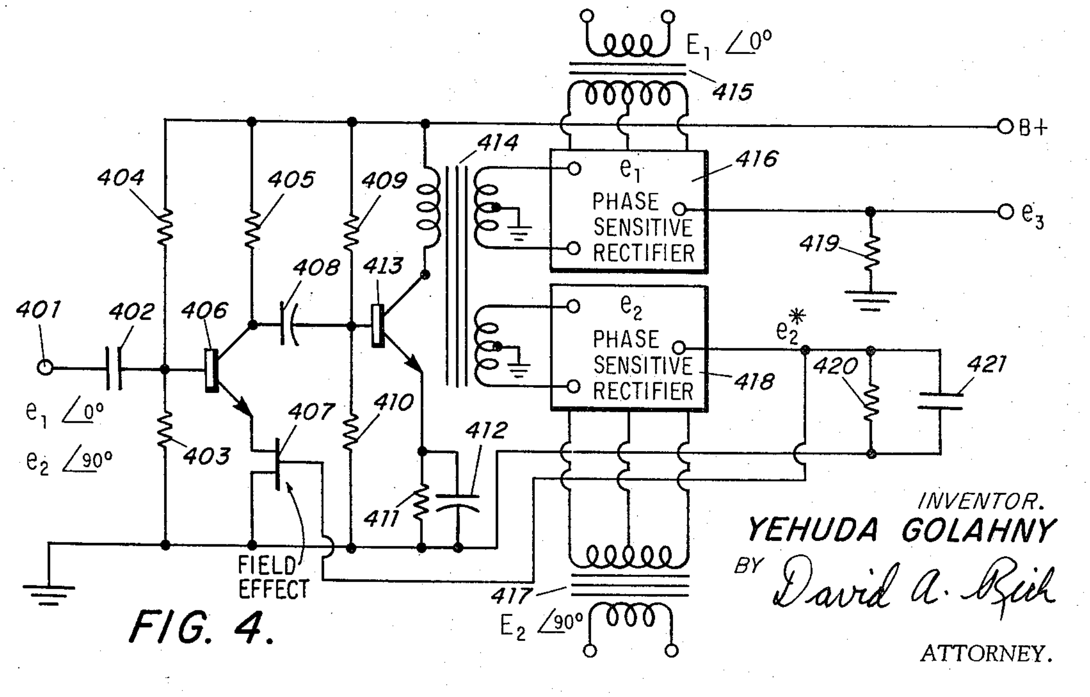
FIG. 4 is a schematic circuit diagram of a modification of the circuit in FIG. 1 adapted to a pair of input signals differing in phase.

Referring now to FIG. 4, there is here illustrated a divider circuit adapted for a pair of input signals of the same frequency, but differing in phase. The signals $e_1$ and $e_2$ for example, are indicated as in phase quadrature. The signals are applied to an input terminal 401 through a capacitor 402 to the base of a bipolar transistor 406. The emitter of the transistor 406 is connected to the drain of a field effect transistor 407 which has its source grounded. The base of the transistor 406 is connected through a resistor 403 to ground and through a resistor 404 to a source of positive voltage labeled B+. The collector of the transistor 406 is coupled through a load resistor 405 to B+ and through a coupling capacitor 408 to a base of a second bipolar transistor 413. The base is connected through a resistor 410 to ground and through a resistor 409 to B+.

The emitter of the transistor 413 is connected through a bias resistor 411 and a by-pass capacitor 412 to ground. The collector of the transistor 413 is connected through the primary of a load transformer 414 to B+. A secondary winding of the transformer 414 is coupled to a phase sensitive rectifier 416 for the signal $e_1$. A reference signal $E_1$ at phase angle 0° is coupled through a transformer 415 to the rectifier 416. The output signal $e_3$ appears across a load resistor 419. The other secondary winding of the transformer 414 is coupled through a phase sensitive rectifier 418 for the signal $e_2$ to appear across an output resistor 420 to ground. A capacitor 421 is connected in parallel with the resistor 420. A source of reference voltage $E_2$ at phase angle 90° is supplied by a transformer 417 coupled to the rectifier 418. The output of the rectifier 418 is coupled to the gate or grid of the field effect transistor 407 to vary its impedance in the manner described above. The divided output signal $e_3$ is thus representative of the quotient of the input signals $e_1$ and $e_2$. Note that the output signal $e_3$ is a D.C. signal.

Figure 5:
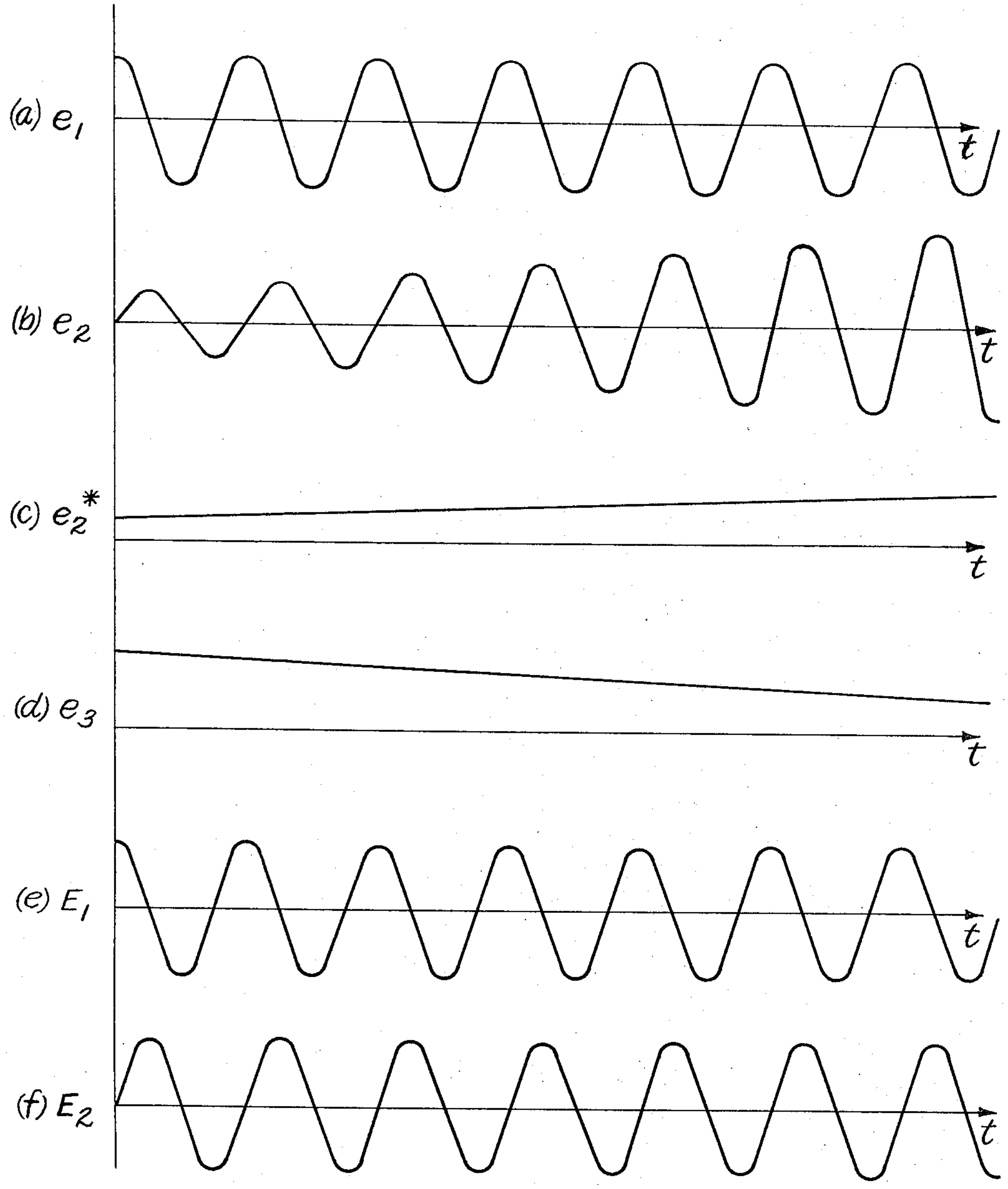
FIG. 5 is a series of graphs relative to the operation of the circuit in FIG. 4.

In FIG. 5, the curve (*a*) illustrates the input signal $e_1$ arbitrarily shown of constant amplitude of 0° phase. The curve (*b*) illustrates the signal $e_2$ displaced at 90° in phase from the signal $e_1$ and rising in amplitude. In the curve (*c*) the output signal $e_2$ of the phase sensitive rectifier 418 is shown. Curve (*d*) illustrates the output voltage $e_3$. The curve (*e*) illustrates the reference signal $E_1$ at 0° in phase as applied to the phase sensitive rectifier 416, and the curve (*f*) illustrates the reference signal $E_2$ displaced 90° from $E_1$, as applied to the rectifier 418.

The operation of the circuit in FIG. 4 is similar in concept to the circuit in FIG. 1, differing in detail as required to process signals displaced in phase as opposed to signals displaced in frequency. The composite signal, $e_1$, at 0° and $e_2$ at 90°, is coupled through the terminal 401 to the variable gain amplifier associated with the bipolar transistor 406. The composite signal is then amplified in the amplifier circuit associated with the transistor 413. The transformer 414 couples the circuit to the rectifiers 416 and 418. The output of the rectifier 418 is the feedback signal $e_2$ which is substantially constant and is coupled back to the field effect transistor 407 to vary its impedance and hence the gain of the amplifier associated with the bipolar transistor 406 as described above. In accordance with well known phase sensitive rectifier principles the output of each rectifier is a D.C. signal. The output signal $e_3$ is representative of the quotient of the amplitudes of the signals $e_1$ and $e_2$.

The phase sensitive rectifiers 416 and 418 may be purchased from Natel, Model B6005 or equivalent. The operational amplifier used in FIG. 2 may be purchased from Nexus, Model DA–1A or equivalent.

From the foregoing discussion, it will be apparent that the invention has broad application to the problem of dividing a pair of separable signals and providing an output signal representative of the quotient.

While there has hereinbefore been presented what is at present considered to be the preferred embodiment of the invention, it will be apparent to those of ordinary skill in the art that many modifications and changes may be made thereto without departing from the true spirit and scope of the invention. It will be considered, therefore, that all those changes and modifications which fall fairly within the scope of the invention will be a part of the invention.

What is claimed is:

1. Divider circuit means for dividing the amplitudes of a pair of input signals to produce an output signal representative of the resultant quotient, comprising:

variable gain amplifier means adapted to receive said pair of signals which are distinguishable with respect to a selected characteristic, said amplifier means having a bipolar transistor;

gain control means including a field effect transistor, directly coupled to said amplifier means for controlling the gain of said amplifier means, said amplifier means being coupled to said field effect transistor;

gain control bias filter means coupled to said amplifier means and said control means for biasing said gain control means only in accordance with the amplitude of a selected one of said signals; and output filter means coupled to said amplifier means for producing an output signal representative of said quotient between the amplitudes of the other said signal and said selected signal.

2. The divider circuit of claim 1, wherein:

said signals differ in frequency and said bias filter means passes only said selected signal.

3. The divider circuit of claim 2, wherein:

a direct current path extends from said bipolar transistor to said field effect transistor.

4. The divider circuit of claim 1, wherein:

said signals are of the same frequency but differ in phase and said bias filter means passes only said selected signal.

5. The divider circuit of claim 1, wherein:

said signals are displaced in time and said bias filter means passes only said selected signal.

6. Divider circuit means for dividing the amplitudes of a pair of input signals to produce an output signal representative of the resultant quotient, comprising:

variable gain amplifier means adapted to receive said pair of signals which are distinguishable with respect to a selected characteristic for amplifying said input signals;

gain control means directly coupled to said amplifier means for controlling the gain of said amplifier means to maintain the amplitude of a selected one of said amplified signals constant;

gain control bias filter means coupled to said amplifier means and said control means for biasing said gain control means only in inverse proportion to the amplitude of said selected one of said signals; and output filter means coupled to said amplifier means for said quotient of the input signal amplitudes of the other said input signal and said selected signal.

References Cited by the Examiner

UNITED STATES PATENTS

| | | | |
|---|---|---|---|
| 2,682,366 | 6/1954 | Burgett | 235—196 X |
| 2,971,159 | 2/1961 | Wilcox et al. | 330—139 X |
| 3,188,575 | 6/1965 | Sheffet | 330—39 X |

ARTHUR GAUSS, *Primary Examiner.*

J. ZAZWORSKY, *Assistant Examiner.*